United States Patent
Chappo et al.

(10) Patent No.: US 11,749,706 B2
(45) Date of Patent: Sep. 5, 2023

(54) QUANTUM DOT POROUS SILICON MEMBRANE-BASED RADIATION DETECTOR

(71) Applicants: KONINKLIJKE PHILIPS N.V., Eindhoven (NL); WAYNE STATE UNIVERSITY, Detriot, MI (US)

(72) Inventors: Marc Anthony Chappo, Elyria, OH (US); Stephanie Lee Brock, Ferndale, MI (US)

(73) Assignees: KONINKLIJKE PHILIPS N.V., Eindhoven (NL); WAYNE STATE UNIVERSITY, Detroit, MI (US)

( * ) Notice: Subject to any disclaimer, the term of this patent is extended or adjusted under 35 U.S.C. 154(b) by 150 days.

(21) Appl. No.: 17/439,440

(22) PCT Filed: Mar. 16, 2020

(86) PCT No.: PCT/EP2020/057015
§ 371 (c)(1),
(2) Date: Sep. 15, 2021

(87) PCT Pub. No.: WO2020/187808
PCT Pub. Date: Sep. 24, 2020

(65) Prior Publication Data
US 2022/0181380 A1 Jun. 9, 2022

Related U.S. Application Data

(60) Provisional application No. 62/820,918, filed on Mar. 20, 2019.

(51) Int. Cl.
*H01L 27/146* (2006.01)
*G01N 23/046* (2018.01)
(Continued)

(52) U.S. Cl.
CPC ..... *H01L 27/14676* (2013.01); *G01N 23/046* (2013.01); *G01T 1/24* (2013.01); *G01T 1/2018* (2013.01)

(58) Field of Classification Search
CPC ... H01L 27/14676; G01N 23/046; G01T 1/24; G01T 1/2018
See application file for complete search history.

(56) References Cited

U.S. PATENT DOCUMENTS

| 10,527,739 | B2 | 1/2020 | Chappo |
| 11,041,966 | B2 | 6/2021 | Chappo |

(Continued)

FOREIGN PATENT DOCUMENTS

| WO | WO9928764 A1 | 6/1999 |

OTHER PUBLICATIONS

PCT International Search Report, International application No. PCT/EP2020/057015, dated Jun. 22, 2020.
(Continued)

*Primary Examiner* — Kiho Kim
(74) *Attorney, Agent, or Firm* — Larry Liberchuk

(57) ABSTRACT

A detection layer (416) for a radiation detector (400) includes a porous silicon membrane (418). The porous silicon membrane includes silicon (419) with a first side (430) and a second opposing side (432), a plurality of pores (420) extending entirely through the silicon from the first side to the second opposing side, each including shared walls (426), at least one protrusion of silicon (424) protruding out and extending from the first side a distance (504, 604, 704). The porous silicon membrane further includes a plurality of radiation sensitive quantum dots (422) in the pores and a quantum dot layer disposed on the first side and having a surface (434) and a thickness (506, 606, 706), wherein the thickness is greater than the distance.

20 Claims, 4 Drawing Sheets

(51) Int. Cl.
   *G01T 1/24* (2006.01)
   *G01T 1/20* (2006.01)

(56) References Cited

U.S. PATENT DOCUMENTS

2012/0175584 A1* 7/2012 Weinberg ............... G21H 1/04
   257/E31.039
2018/0172847 A1 6/2018 Nelson
2018/0203134 A1 7/2018 Chappo

OTHER PUBLICATIONS

Urdaneta M. et al., "Porous Silicon-Based Quantum Dot Broad Spectrum Radiation Detector", Journal of Instrumentation, Institute of Physics Publishing, Bristol, GB, vol. 6, No. 1, Jan. 11, 2011, p. C01027, XP020203483.

Keshavarzi S. et al., "Formation Mechanisms of Self-Organized Needles in Porous Silicon Based Needle-Like Surfaces", Journal of the Electrochemical Society, vol. 165, No. 3, Jan. 1, 2018, pp. E108-EII4, XP055701086.

Urdaneta M. et al., "Quantum Dot Composite Radiation Detectors", Weinberg Medical Physics LLC, Wayne State University, Photodiodes—World Activities, 2011, pp. 353-366.

* cited by examiner

QUANTUM DOT POROUS SILICON MEMBRANE-BASED RADIATION DETECTOR

FIELD OF THE INVENTION

The following generally relates to imaging and more particular to a quantum dot (QD) porous silicon (pSi) membrane-based radiation detector, and is described with particular application to computed tomography (CT) imaging; however, the QD-pSi membrane-based radiation detector is also amicable in other applications such as nuclear medicine, spectral radiation detectors for physics and astronomy applications, etc.

BACKGROUND OF THE INVENTION

Radiation detectors comprising a block of porous silicon (pSi) with Quantum Dots (QD) of radiation absorptive materials in column shaped pores of the pSi (i.e. QD-pSi radiation detectors) require two-sided flatness (within microns) for bonding with other layers of materials. FIG. 1 shows a diagrammatic cross-sectional perspective illustration of a sub-portion of an example of such a block of pSi. In this example, a block of pSi 102 includes a plurality of pores 104 extending only partially down a thickness 106 of the block 102, a top/first side 110 of Si, and a bottom/second opposing side 112. The pores 104 are filled with QDs (not shown). Both the top side 110 and the bottom side 112 have a generally flat surface, which allows for bonding with other layers of materials. It is understood that top and bottom sides 110 and 112 are diagrammatic representations and the orientation can be flipped such that top becomes bottom and vice versa.

A pSi-membrane, in contrast, has pores entirely through the Si. However, due to the pore fabrication process, the pSi-membrane will include protrusions of Si (physical imperfections) around and extending outward from openings of the pores on one side of the pSi-membrane. FIG. 2 shows a diagrammatic cross-sectional perspective illustration of a sub-portion of an example of such a pSi-membrane. In this example, a pSi-membrane 202 includes a plurality of pores 204 extending entirely through a thickness 206, a first side 210, and a second opposing side 212. The pores 204 are filled with QDs (not shown). The first side 210 has a generally flat surface, but the second opposing side 212 has an irregular (non-flat) surface with Si protrusions 214 (only one shown for clarity). Prediction of formation and size of the protrusions 214 is discussed in Keshavarzi et al., "Formation Mechanisms of Self-Organized Needles in Porous Silicon Based Needle-Like Surfaces," Journal of The Electrochemical Society, 165 (3) E108-E114 (2018).

Since the pSi-membrane 202 will not have two-sided flatness, it is not well-suited for integrated or stacked, multi-layer QD-pSi detectors, which require two-sided (top and bottom) flatness for bonding with other layers of materials. Processing technologies such as grinding and/or polishing can be added to the fabrication process to reduce or remove the protrusions of Si. However, these additional fabrication processing steps add significant cost and/or time to the overall fabrication process and thus the product cost.

SUMMARY OF THE INVENTION

Aspects described herein address the above-referenced problems and others.

The following generally relates to a porous silicon (pSi) membrane with pores extending through a thickness of the pSi membrane, filled with quantum dots (QDs), and including protrusions of Si. As described in greater detail blow, in one non-limiting instance, the pSi membrane is part of a radiation detector and the protrusions of Si are incorporated into the fabrication process without adding any additional fabrication steps.

In one aspect, a detection layer for a radiation detector includes a porous silicon membrane. The porous silicon membrane includes silicon with a first side and a second opposing side, a plurality of pores extending entirely through the silicon from the first side to the second opposing side, each including shared walls, at least one protrusion of silicon protruding out and extending from the first side a distance. The porous silicon membrane further includes a plurality of radiation sensitive quantum dots in the pores and a quantum dot layer disposed on the first side and having a surface and a thickness, wherein the thickness is greater than the distance.

In another aspect, an imaging system includes a radiation source that transmits radiation, a detector array including a detector with a detection layer that detects radiation transmitted by the radiation source and generates a signal indicative thereof, and a reconstructor that reconstructs the signal to generate volumetric image data. The detection layer may include one or more porous silicon membrane(s), including silicon with a first side and a second opposing side, a plurality of pores extending entirely through the silicon from the first side to the second opposing side, each including shared walls, at least one protrusion of silicon protruding out and extending from the first side a distance. The detection layer further includes a plurality of radiation sensitive quantum dots in the pores and a quantum dot layer disposed on the first side and having a surface and a thickness, wherein the thickness is greater than the distance.

In another aspect, a method includes transmitting, with a radiation source, radiation and receiving, with a detector, transmitted radiation and generating a signal indicative thereof. The detection layer includes one or more porous silicon membrane(s) with a first side and a second opposing side, a plurality of pores extending entirely through the silicon from the first side to the second opposing side, each including shared walls, and at least one protrusion of silicon protruding out and extending from the first side a distance. The detection layer further includes a plurality of radiation sensitive quantum dots in the pores and a quantum dot layer disposed on the first side and having a surface and a thickness, wherein the thickness is greater than the distance.

Those skilled in the art will recognize still other aspects of the present application upon reading and understanding the attached description.

BRIEF DESCRIPTION OF THE DRAWINGS

The invention may take form in various components and arrangements of components, and in various steps and arrangements of steps. The drawings are only for purposes of illustrating the embodiments and are not to be construed as limiting the invention.

DETAILED DESCRIPTION OF EMBODIMENTS

The following generally relates to a porous silicon (pSi) membrane with pores extending through a thickness of the pSi membrane, filled with quantum dots (QDs), and including protrusions of Si. In one non-limiting instance, as described in greater detail below, the pSi membrane is part of a radiation detector and the protrusions of Si are incorporated into the fabrication process without adding any additional fabrication steps.

Figure 3:
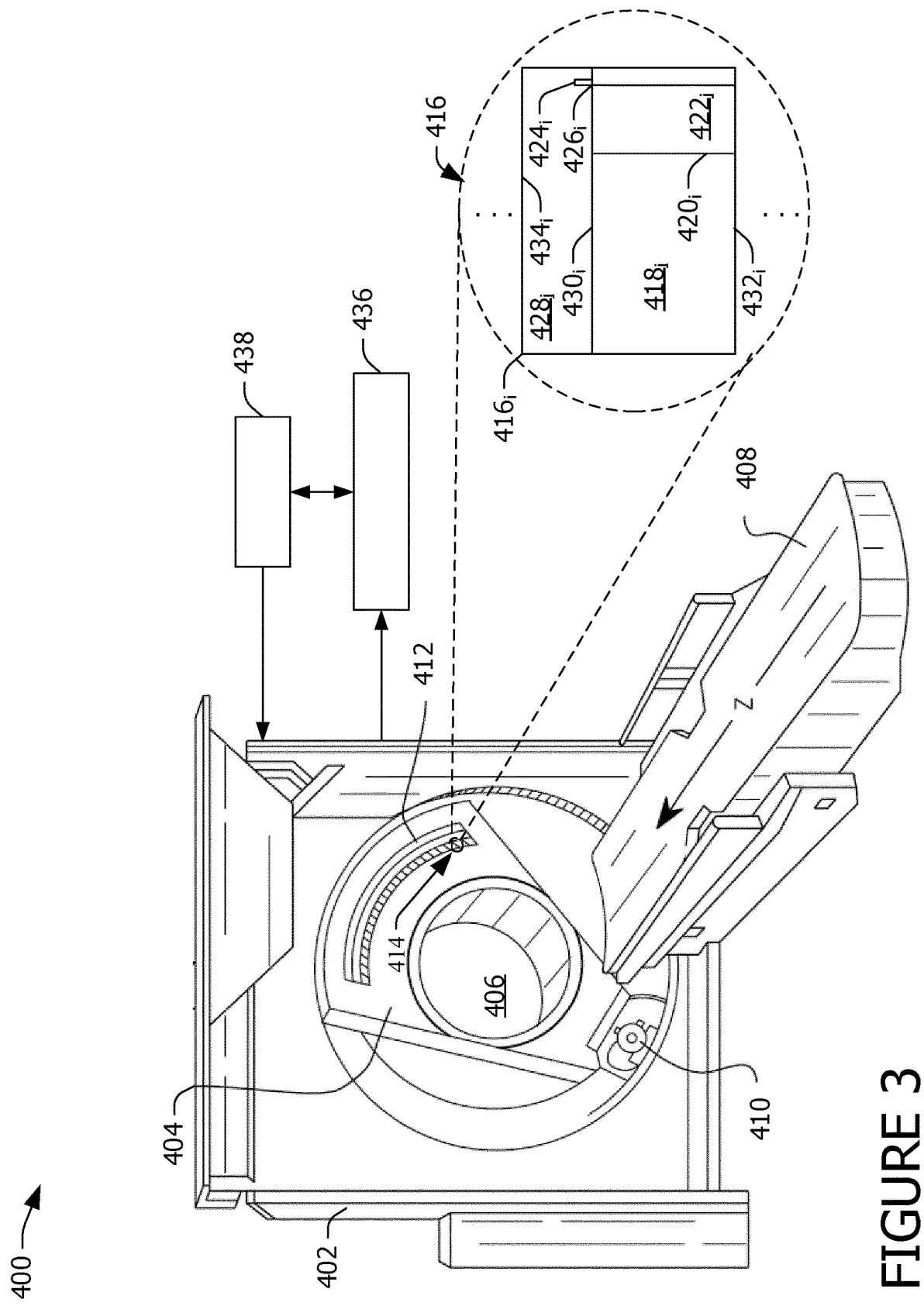
FIG. 3 diagrammatically illustrates an example imaging system with a radiation detector that includes a pSi-membrane with QDs in the pores, in accordance with an embodiment(s) herein.

FIG. 3 diagrammatically illustrates an imaging system $400$ such as a computed tomography (CT) scanner. The imaging system $400$ includes a stationary gantry $402$ and a rotating gantry $404$, which is rotatably supported by the stationary gantry $402$ and rotates around an examination region $406$ about a longitudinal or z-axis ("Z").

A subject support $408$, such as a couch, supports a subject or object in the examination region $406$. The subject support $408$ is movable in coordination with performing an imaging procedure so as to guide the subject or object with respect to the examination region $106$ for loading, scanning, and/or unloading the subject or object.

A radiation source $410$, such as an X-ray tube, is supported by and rotates with the rotating gantry $404$ around the examination region $406$. The radiation source $410$ emits X-ray radiation that is collimated e.g., by a source collimator (not visible) to form a generally fan, wedge, cone or other shaped X-ray radiation beam that traverses the examination region $406$.

A radiation sensitive detector array $412$ subtends an angular arc opposite the radiation source $410$ across the examination region $406$. The radiation sensitive detector array $412$ includes one or more rows of detectors $414$. The detectors $414$ detect radiation traversing the examination region $406$ and generate electrical signals (projection data) indicative thereof. In the illustrated example, each detector $414$ includes at least one or more detection layer(s) $416$. For sake of clarity, only one detection layer $416_i$ is discussed in detail. The other detection layers $416$ (if any) are structurally substantially similar to the detection layer $416_i$ and thus will not be described in detail.

The detection layer $416_i$ includes a pSi-membrane $418_i$ with pores $420_i$ (only one shown for clarity) filled with QDs $422_i$ (and/or any other material to convert radiation or light to electrical charge), Si protrusions $424_i$ (only one shown for clarity) extending outward (relative to the pSi-membrane $418_i$) from Si walls $426_i$ of the pores $420_i$, a QD layer $428_i$ on a side $430_i$ with the Si protrusions $424_i$ and covering the Si protrusions $424_i$, an opposing side $432_i$, which is opposite the side $430_i$, and a surface $434_i$. An example of suitable QDs is described in application serial number EP 14186022.1, entitled "Encapsulated materials in porous particles," and filed on Sep. 23, 2014, the entirety of which is incorporated herein by reference.

In one embodiment, the side $430_i$ is proximal to the radiation source $410$ and the opposing side $432_i$ is distal to the radiation source $410$, and, in another embodiment, the opposing side $432_i$ is proximal to the radiation source $410$ and the side $430_i$ is distal to the radiation source $410$. As described in greater detail below, with these embodiments the pSi protrusions $424_i$ are incorporated into the existing fabrication of the detectors $414$ and no new steps are added to the fabrication process. As such, these embodiments mitigate adding additional fabrication steps to the fabrication process such as grinding and/or polishing steps to reduce or remove the Si protrusions $424_i$ and thus the additional cost and/or time associate with such additional fabrication steps.

In one instance, the detection layer(s) $416$ includes an indirect conversion (e.g., a scintillator/photosensor pair) detector. In another instance, the detection layer(s) $416$ includes a direction conversion detector. Examples of pSi-based scintillator/photosensor and direction conversion detection layers are described in patent application Ser. No. 62/202,397, filed Aug. 7, 2015, and entitled "Quantum Dot Based Imaging Detector," and patent application Ser. No. 62/312,083, filed Mar. 23, 2016, and entitled "Radiation Detector Scintillator with an Integral Through-Hole Interconnect," the entireties of both are incorporated herein by reference.

For multi-detection layer configurations, routing signals through pixel walls described in patent application Ser. No. 62/412,876, filed Oct. 26, 2016, and entitled "Nano-Material Imaging Detector with an Imaging Detector with an Integral Pixel Border," which is incorporated herein by reference in its entirety. A pixel wall with QDs in its border is further described in patent application Ser. No. 62/312,083, filed Mar. 23, 2016, and entitled "Nano-Material Imaging Detector with an Integral Pixel Border," which is incorporated herein by reference in its entirety.

A reconstructor $436$ reconstructs the projection data to generate volumetric image data. An operator console $438$ includes a human readable output device such as a display monitor, a filmer, etc., and an input device such as a keyboard, mouse, etc. The operator console $438$ is configured to control the rotating gantry $404$, the subject support $408$, the radiation source $410$, the radiation detector $412$, and/or the reconstructor $436$.

Figure 4:
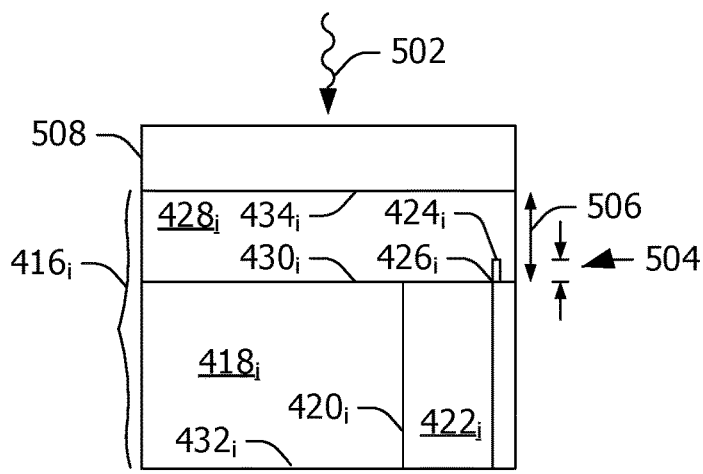
FIG. 4 diagrammatically illustrates an example of the detector with the pSi-membrane bonded to a top contact, in accordance with an embodiment(s) herein.

FIG. 4 diagrammatically illustrates an example of the detection layer $416_i$ bonded to a top contact $508$. In this embodiment, the side $430$, is proximal to the radiation source $410$ of FIG. 3 and hence incoming radiation $502$. The protrusion of Si $424_i$ protrudes from the Si walls $426_i$ on the side $430_i$ a distance $504$. The QD layer $428_i$ has a thickness $506$, which is greater than the distance $504$. As such, the protrusion of Si $424_i$ is entirely embedded in the QD layer $428_i$ and does not impact the flatness of the surface $434_i$. In this example, the surface $434_i$ is bonded to a top contact $508$, and the QD layer $428_i$ includes a radiation attenuating material (e.g., lead sulfide, PbS), which attenuates the incoming radiation $502$. The bottom side $432_i$ can be bonded to another detection layer $416_i$ or other layer.

Figure 5:
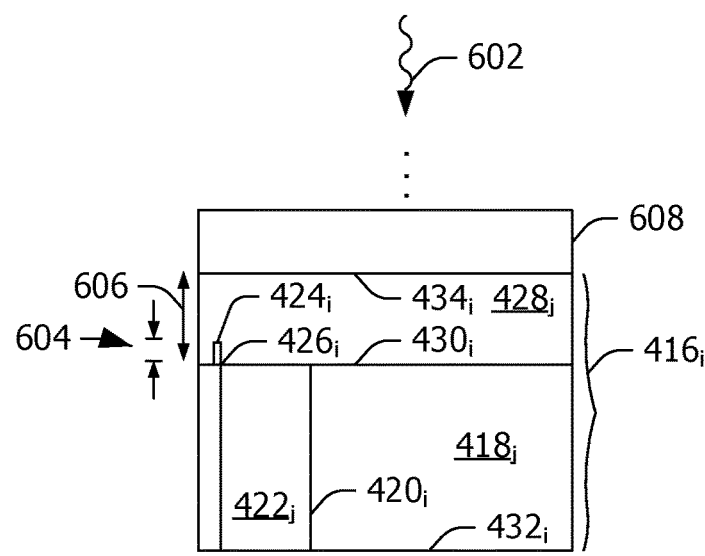
FIG. 5 diagrammatically illustrates an example of the detector with the pSi-membrane bonded to another layer, in accordance with an embodiment(s) herein.

FIG. 5 diagrammatically illustrates an example of the detection layer $416_i$ bonded to another layer. In this embodiment, the side $430_i$ is proximal to the radiation source 410 of FIG. 3 and hence incoming radiation 602. The protrusion of Si $424_i$ protrudes from the Si walls $426_i$ on the side $430_i$ a distance 604. The QD layer $428_i$ has a thickness 606, which is greater than the distance 604. As such, the protrusion of Si $424_i$ is entirely embedded in the QD layer $428_i$ and does not impact the flatness of the surface $434_i$. In this example, the surface $434_i$ is bonded to a layer 608, such as another detection layer 416 and/or other layer. In another embodiment, another layer is bonded to the layer 608. Additionally, or alternatively, the bottom side $432_i$ can be bonded to another detection layer $416_i$ or other layer.

The following describes a non-limiting process for forming the QD layer $428_i$ of the detection layer $416_i$ of FIGS. 5 and/or 6. For the QD layer $428_i$, deposition of QDs can be through dip- or spin-coating techniques employing the same colloidal QD solutions used for filling the of the pores $420_i$. Sequential deposition steps can be used to build the QD layer $428_i$ up to the thickness 506 (e.g., twenty-five (25) microns or more). This approach is general for colloidal solutions of nanoparticles, irrespective of composition, as well as dispersible polymers. Alternatively, physical or chemical vapor deposition of non-colloidal films (e.g., metal or semiconductor contacts) can be performed.

Figure 1:
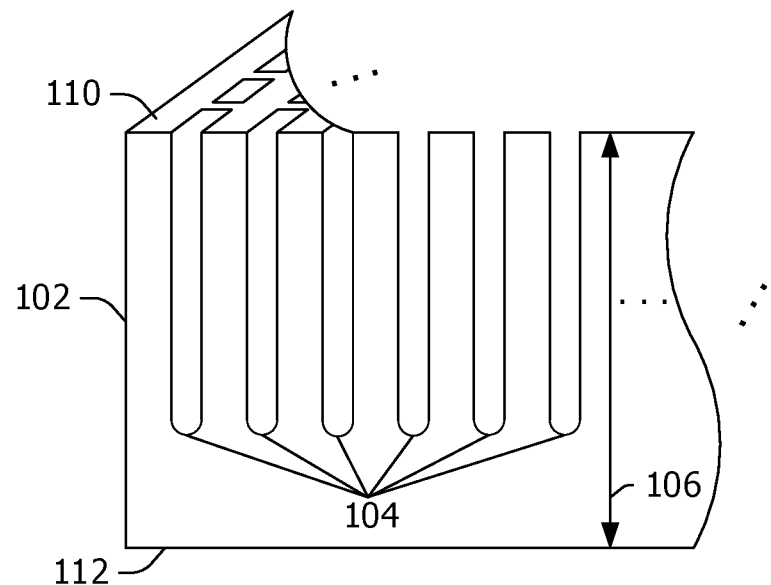
FIG. 1 diagrammatically illustrates a block of pSi, in accordance with an embodiment(s) herein.
Figure 2:
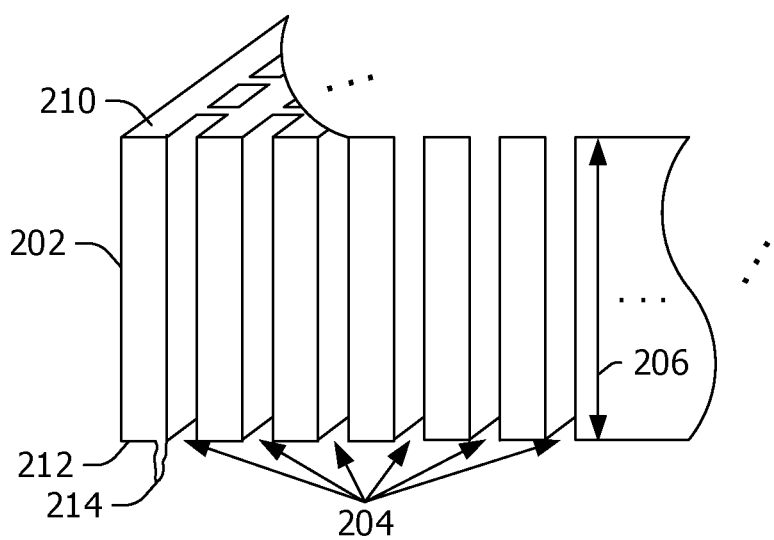
FIG. 2 diagrammatically illustrates a pSi-membrane, in accordance with an embodiment(s) herein.

Utilizing PbS or another suitable material in the QD layer $428_i$ does not add a step to the fabrication process because such a material is utilized to attenuate the incoming radiation 502 whether the detection layer $416_i$ includes the pSi-membrane $418_i$ or the block of pSi 102 (FIG. 1). In addition, the protrusion of Si $424_i$, e.g., at least in the embodiments of FIGS. 5 and/or 6, enhance charge collection efficiency, e.g., by enabling additional charge collection in the QD layer $428_i$ rather than limiting it to a planar surface of the side $430_i$. This allows for the combination of the protrusion of Si $424_i$ and the QD layer $428_i$ to concurrently increase radiation attenuation and output signal. In addition, utilizing the pSi-membrane $418_i$ instead of the block of pSi 102 (FIG. 1) allows for visual inspection and verification prior to the next level of assembly.

Figure 6:
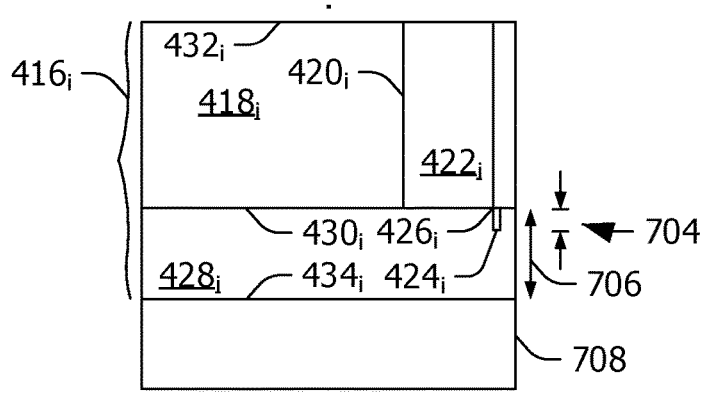
FIG. 6 diagrammatically illustrates an example of the detector with the pSi-membrane bonded to pixel defining contact material, in accordance with an embodiment(s) herein.

FIG. 6 diagrammatically illustrates an example of the detector with the pSi-membrane bonded to pixel defining contact material. In contrast to the embodiments of FIGS. 4 and/or 5, in this embodiment, the opposing side $432_i$ is proximal to the radiation source 410 of FIG. 3 and hence incoming radiation 702. The protrusion of Si $424_i$ protrudes from the Si walls $426_i$ on the side $430_i$ a distance 704. The QD layer $428_i$ has a thickness 706, which is greater than the distance 704. As such, the protrusion of Si $424_i$ is entirely embedded in the QD layer $428_i$ and does not impact the flatness of the surface $434_i$. In this example, the surface $434_i$ is bonded to pixel defining contact material 708.

Figure 7:
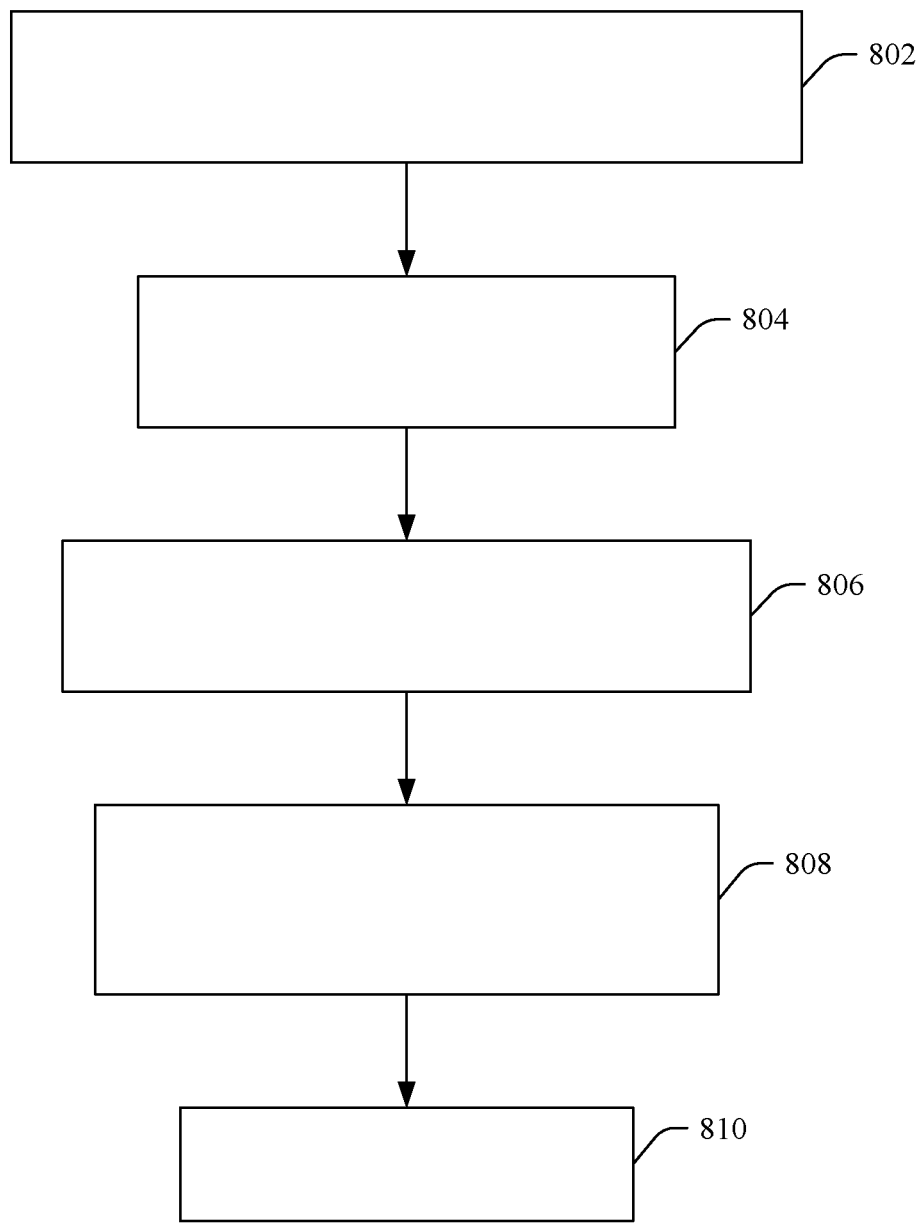
FIG. 7 illustrates an example method in accordance with an embodiment(s) herein.

The following describes a non-limiting process for forming the QD layer $428_i$ of the detection layer $416_i$ of FIG. 7. For the QD layer $428_i$, deposition of QDs can be the same as that for the detection layer $416_i$ of FIGS. 5 and/or 6, with re-orientation of the pSi membrane $418_i$. Alternatively, the QDs $422_i$ passing through the pores $420_i$ can build up the QD layer $428_i$ on the side $430_i$ formed by evaporative drying. In one instance, this enables "capture" of the QDs $422_i$ that do not deposit on the walls $426_i$ of the pores $420_i$. Likewise, utilizing the pSi-membrane $418_i$ instead of the block of pSi 102 (FIG. 1) allows for visual inspection and verification prior to the next level of assembly.

In one non-limiting embodiment, the QD layer $428_i$ in FIGS. 5-7 has a thickness of twenty-five (25) microns or less.

FIG. 7 illustrates an example method in accordance with an embodiment(s) herein.

At 802, X-ray radiation is transmitted through an examination region and is being partially attenuated by an object therein.

At 804, the partially attenuated X-ray radiation is detected by the detector array 412, which includes the pSi membrane $418_i$ with the QDs $422_i$ and the QD layer $428_i$ as described herein.

At 806, the detector array 412, in response to detecting the radiation, generates an electrical signal (projection data) indicative thereof.

At 808, the reconstructor 436 reconstructs the electrical signal, producing volumetric image data.

At 810, the console 438 displays volumetric image data.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

The word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A detection layer of a radiation detector, comprising:
   a porous silicon membrane, including:
      a first side and a second opposing side;
      a plurality of pores extending entirely through the porous silicon membrane from the first side to the second opposing side, each including shared walls;
      at least one protrusion of silicon protruding out and extending, from the wall on the first side, a distance;
   a plurality of radiation sensitive quantum dots in the pores; and
   a quantum dot layer disposed on the first side and having a surface and a thickness, wherein the thickness is greater than the distance.

2. The detection layer of claim 1, wherein the surface of the quantum dot layer has a thickness of 25 microns of less.

3. The detection layer of any of claim 1, further comprising:
   a top contact coupled to the surface of the quantum dot layer.

4. The detection layer of claim 3, wherein the quantum dot layer includes quantum dots containing lead and sulfur.

5. The detection layer of claim 3, wherein the protrusion of silicon collects charge produced in the quantum dot layer.

6. The detection layer of claim 1, further comprising:
a second layer disposed on the surface of the quantum dot layer.

7. The detection layer of claim 6, wherein the second layer includes a second porous silicon membrane.

8. The detection layer of claim 1, further comprising:
a second layer disposed on the second opposing side of the porous silicon membrane.

9. The detection layer of claim 8, wherein the second layer includes a second porous silicon membrane with a second quantum dot layer having a second surface, and the second quantum dot layer is disposed on the second opposing side of the porous silicon membrane.

10. The detection layer of claim 1, further comprising:
a pixel defining contact material disposed on the quantum dot layer.

11. The detection layer of claim 10, wherein the second side is configured to receive radiation.

12. An imaging system, comprising:
a radiation source that transmits radiation;
a detector array including a detector with a detection layer, the detection layer including:
a porous silicon membrane; including:
silicon with a first side and a second opposing side;
a plurality of pores extending entirely through the silicon from the first side to the second opposing side, each including shared walls;
at least one protrusion of silicon protruding out and extending, from the first side, a distance;
a plurality of radiation sensitive quantum dots in the pores; and
a quantum dot layer disposed on the first side and having a surface and a thickness, wherein the thickness is greater than the distance, wherein the detector detects radiation transmitted by the radiation source and generates a signal indicative thereof; and
a reconstructor that reconstructs the signal to generate volumetric image data.

13. The imaging system of claim 12, wherein the quantum dot layer includes quantum dots containing lead and sulfur.

14. The imaging system of claim 13, wherein the detection layer further includes a top contact coupled to the surface of the quantum dot layer.

15. The imaging system of claim 13, wherein the detection layer includes a second detection layer disposed on the surface of the quantum dot layer.

16. The imaging system of claim 13, wherein the detection layer includes a second detection layer disposed on the second side of the porous silicon membrane.

17. The imaging system of claim 12, wherein the detection layer further includes a pixel defining contact material disposed on the quantum dot layer.

18. A method, comprising:
transmitting, with a radiation source, radiation; and
receiving, with a detector, transmitted radiation and generating a signal indicative thereof, wherein the detection layer includes:
a porous silicon membrane; including:
silicon with a first side and a second opposing side;
a plurality of pores extending entirely through the silicon from the first side to the second opposing side, each including shared walls;
at least one protrusion of silicon protruding out and extending, from the first side, a distance;
a plurality of radiation sensitive quantum dots in the pores; and
a quantum dot layer disposed on the first side and having a surface and a thickness, wherein the thickness is greater than the distance.

19. The method of claim 18, further comprising:
transferring collected charge from the quantum dot layer to an electronics layer.

20. The method of claim 18, comprising:
converting radiation to electrical charge in the quantum dot layer; and
collecting charge in the quantum dot layer with the protrusion of silicon.

* * * * *